(12) United States Patent
Kawasuji

(10) Patent No.: US 6,188,144 B1
(45) Date of Patent: Feb. 13, 2001

(54) POWER SUPPLY UNIT FOR PULSED LASER USING MAGNETIC SWITCH

(75) Inventor: Yasufumi Kawasuji, Oyama (JP)

(73) Assignee: Komatsu Ltd, Tokyo (JP)

(*) Notice: Under 35 U.S.C. 154(b), the term of this patent shall be extended for 0 days.

(21) Appl. No.: 09/437,670

(22) Filed: Nov. 10, 1999

(30) Foreign Application Priority Data

Nov. 11, 1998 (JP) ................................... 10-320774
Nov. 11, 1998 (JP) ................................... 10-320775

(51) Int. Cl.$^7$ ................................... H03K 3/00
(52) U.S. Cl. ................... 307/108; 372/38.08; 307/107
(58) Field of Search .................. 307/108, 110, 307/106, 107; 372/38.08; 363/59, 60, 61

(56) References Cited

U.S. PATENT DOCUMENTS

| | | | |
|---|---|---|---|
| 4,549,091 | * 10/1985 | Fahlen et al. | 307/106 |
| 5,708,676 | * 1/1998 | Minamitani et al. | 372/86 |
| 5,729,562 | * 3/1998 | Birx et al. | 372/38 |
| 5,914,974 | * 6/1999 | Partlo et al. | 372/38 |

* cited by examiner

Primary Examiner—Shawn Riley
(74) Attorney, Agent, or Firm—Varndell & Varndell, PLLC

(57) ABSTRACT

A plurality of series circuits of saturable reactors and transferring capacitors are connected in parallel to a peaking capacitor, the plurality of saturable reactors are magnetically coupled, and saturable reactors for finely adjusting a transfer initiation time are connected in series to the plurality of saturable reactors. Otherwise, a plurality of series circuits of saturable reactors and transferring capacitors are connected in parallel to the peaking capacitor, the plurality of saturable reactors are magnetically coupled, and post-saturation inductances of the plurality of saturable reactors are made different.

18 Claims, 11 Drawing Sheets

POWER SUPPLY UNIT FOR PULSED LASER USING MAGNETIC SWITCH

BACKGROUND OF THE INVENTION

1. Field of the Invention

The present invention relates to a power supply unit for a pulse laser using a magnetic switch (saturable reactor) used for pulse discharging a laser, and more particularly to an improvement for lowering the peaking capacity of the pulse laser without lowering the energy per pulse of the laser pulse.

2. Description of the Related Art

As a pulse power supply unit for a high-power pulse laser and an accelerator, those using a magnetic pulse compression circuit are often used for the improvement of the durability of a main switch such as a thyratron and GTO these years.

FIG. 20 shows an equivalent circuit of a general capacity shift type of magnetic pulse compression device used for the pulse power supply of a pulse laser, and FIG. 21 shows an example of waveforms of the voltage and the current at respective points of the circuit shown in FIG. 20.

The discharge circuit of FIG. 20 is a two-step magnetic pulse compression circuit utilizing a saturation phenomenon of three magnetic switches AL0 to AL2 which consist of saturable reactors.

In FIG. 20, the electric charge is charged from high-voltage power supply HV to capacitor C0 through magnetic switch AL0 and coil L1.

Then, when pulse oscillation synchronizing signal (trigger signal) TR which turns on in synchronization with the repetition frequency of the pulse laser oscillation is input, main switch SW is turned on at this point (time t0 in FIG. 10). When the main switch SW is turned on, potential VSW of the main switch SW drops suddenly to zero, and then when time product (integration value of time of voltage VC0) S0 of voltage difference VC0-VSW between the capacitor C0 and the main switch SW which are both end voltages of the magnetic switch AL0 reaches a limit value decided depending on a set characteristic of the magnetic switch AL0, the magnetic switch AL0 is saturated at this time t1, and current pulse i0 flows through a loop of the capacitor C0, the magnetic switch AL0, the main switch SW and capacitor C1.

Time δ0 elapsed between the start of flowing the current pulse i0 and its termination to become zero (time t2), namely, electric charge transfer time δ0 elapsed to complete the transfer of the electric charge from the capacitor C0 to the capacitor C1, is determined by respective capacities of a post-inductance of the magnetic switch AL0, the capacitor C0 and the capacitor C1, provided that a loss by the main switch SW and the like is disregarded.

When time product S1 of voltage VC1 of the capacitor C1 reaches a limit value which is determined by a determined characteristic of the magnetic switch AL1, the magnetic switch AL1 saturates at this time t3 to have a low inductance. Thus, current pulse i1 flows through a loop of the capacitor C1, capacitor C2 and the magnetic switch AL1. This current pulse i1 becomes zero at time t4 after a lapse of predetermined transfer time δ1 which is determined by the capacities of the capacitors C1 and C2 and the post-saturation inductance of the magnetic switch AL1.

And, when time product S2 of voltage VC2 of the capacitor C2 reaches a limit value which is determined by a determined characteristic of the magnetic switch AL2, the magnetic switch AL2 is saturated at this time t5, and current pulse i2 flows through a loop of the capacitor C2, peaking capacitor CP and the magnetic switch AL2.

Then, voltage VCp of the peaking capacitor Cp rises with the progress of charging, and when this voltage VCp reaches a predetermined main discharge initiation voltage, a dielectric breakdown of the laser gas is caused between main electrodes 10 at this time t6 to start the main discharge. The laser medium is excited by this main discharge, and the laser light is generated in several nsec.

Then, the voltage of the peaking capacitor Cp drops rapidly by the main discharge and returns to the state before starting to charge after a lapse of predetermined time.

This electric discharge operation is repeated by the switching operation of the main switch SW which is synchronized with the trigger signal TR, and the pulse laser oscillation is performed at a fixed repetition frequency (pulse oscillation frequency).

In this case, since it is determined that the inductances of the charge transfer circuits in respective stages comprising the magnetic switch and the capacitor become small toward the final stage, the pulse compression operation is performed so that the peak value of current pulses i0 to i2 rises sequentially and the current-carrying width becomes small sequentially. As a result, an intense electric discharge is obtained between the main electrodes 6 in a short time.

When the pulse compression rate is excessively raised by the aforesaid magnetic pulse compression, there is obtained a pulse laser light having a short pulse width and high peak output. But, this pulse laser light having a short pulse width and high peak output causes various problems such as follows:

- durability of optical parts installed in the laser resonator is degraded;
- a round trip frequency (shuttling frequency of the laser light in the resonator) is decreased; and
- an incidence frequency to a narrow-banding optical element decreases as the round trip frequency is decreased, and a narrow-banding efficiency drops.

Accordingly, the pulse laser light that its pulse width is not too short and its peak output is not too large is often demanded recently. Because the pulse width becomes long even if the peaking capacity of the pulse laser light is lowered, the energy per pulse of the laser pulse does not become small as compared with the pulse laser light having a short pulse width and a high peak output.

However, the aforesaid conventional technology is designed to transfer all the charges as current pulse i2 from the capacitor C2 to the peaking capacitor Cp at a time. Therefore, the luminescence intensity and the luminescence time of the pulse laser light are determined univocally depending on the electric charge transfer time and the peak value of the current pulse i2 only, and their fine adjustment is hardly made. The aforesaid conventional technology had a limitation in its circuit in increasing the pulse width of the laser pulse because the electric charge transferred from the capacitor C2 to the peaking capacitor Cp is mostly consumed by the electric discharge, and the electric charge is not transferred to the peaking capacitor Cp after the laser luminescence is started.

The present invention was completed in view of the aforesaid circumstances, and it is an object of the invention to provide a power supply unit for a pulse laser, which has a simple structure but can provide a pulse laser light that its pulse width is not too short and its peak output is not too large.

SUMMARY OF THE INVENTION

The invention relates to a power supply unit for a pulse laser comprising discharge electrodes for a pulse laser disposed in a laser medium, a peaking capacitor connected in parallel to the discharge electrodes and a series circuit of saturable reactors and transferring capacitors connected in parallel to the peaking capacitor, which transfers electric charges charged in the transferring capacitors to the peaking capacitor by utilizing a magnetic saturation phenomenon of the saturable reactors to cause a pulse discharge between the discharge electrodes and excites the laser medium so to produce the pulse laser, wherein the series circuit of the saturable reactors and the transferring capacitors is connected in a plurality of numbers in parallel to the peaking capacitor, the plurality of saturable reactors are magnetically coupled, and post-saturation inductances of the plurality of saturable reactors are made different.

In the present invention, the series circuit of the saturable reactors and the transferring capacitors included in an electric charge transfer circuit in a final stage in a magnetic pulse compression circuit is connected in a plurality of numbers in parallel to the peaking capacitor, the plurality of saturable reactors are magnetically coupled, the post-saturation inductances of the plurality of saturable reactors are made different, and the electric charges charged in the plurality of transferring capacitors are started to be transferred to the peaking capacitor after the saturation of the saturable reactors connected in series to the respective transferring capacitors. Since the plurality of saturable reactors in the invention are magnetically coupled, the plurality of saturable reactors are saturated simultaneously even if a change in the electric currents flowing through the respective saturable reactors is variable to some extent due to any types of difference factors before the saturation of the saturable reactors, and the electric charge transfer through the plurality of saturable reactors can be started at the same time.

And, since the post-saturation inductances of the respective saturable reactors are made different, the electric charge transfer durations, when the electric charge is transferred from the respective transferring capacitors to the peaking capacitor, are variable for the respective routes. Accordingly, there are produced the electric charge transferred in a short duration, the electric charge transferred in a relatively long duration and various types of electron charges with variable transfer durations.

Therefore, according to the invention, there is caused a phenomenon of transferring the electric charge to the peaking capacitor through other routes while the laser light is emitted after initiating the electric discharge by the electric charge transferred to the peaking capacitor. Thus, the luminescence duration of the laser light can be extended, and the luminescence intensity per unit time can be reduced. Therefore, according to the present invention, the pulse laser light not having an excessively short pulse width and an excessively large peak output can be obtained by a simple structure.

The invention relates to a power supply unit for a pulse laser comprising discharge electrodes for a pulse laser disposed in a laser medium, a peaking capacitor connected in parallel to the discharge electrodes and a series circuit of saturable reactors and transferring capacitors connected in parallel to the peaking capacitor, which transfers electric charges charged in the transferring capacitors to the peaking capacitor by utilizing a magnetic saturation phenomenon of the saturable reactors to cause a pulse discharge between the discharge electrodes and excites the laser medium so to produce the pulse laser, wherein the saturable reactors are divided into parallel circuits of a plurality of saturable reactors, the plurality of saturable reactors are magnetically coupled, and post-saturation inductances of the plurality of saturable reactors are made different.

According to the invention, in the series circuit of the saturable reactors and the transferring capacitors contained in the electric charge transfer circuit in the final stage in a magnetic pulse compression circuit, the saturable reactors are divided into parallel circuits of a plurality of saturable reactors, the plurality of saturable reactors are magnetically coupled, and the post-saturation inductances of the plurality of saturable reactors are made different. Thus, the electric charge charged into the transferring capacitors is transferred to the peaking capacitor through the plurality of parallel-connected saturable reactors. Since the plurality of saturable reactors are magnetically coupled, the saturation timing is the same among the plurality of saturable reactors, and the electric charge transfer with the presence of the plurality of saturable reactors can be started at the same time. And, since the post-saturation inductances of the plurality of saturable reactors are made different, the electric charge transfer durations for transferring the electric charge from the transferring capacitors to the peaking capacitor are variable among the respective routes, and the electric charge transferred in a short time, the electric charge transferred over a relatively long time and various types of electron charges with variable transfer durations can be produced.

Therefore, according to the invention, there is caused a phenomenon of transferring the electric charge to the peaking capacitor through other routes while the laser light is emitted after the electric discharge is initiated by the electric charge transferred to the peaking capacitor. Thus, the luminescence duration of the laser light can be extended, and the luminescence intensity per unit time can be reduced. Thus, according to the present invention, the pulse laser light not having an excessively short pulse width and an excessively large peak output can be obtained by a simple structure.

The invention relates to a power supply unit for a pulse laser comprising discharge electrodes for a pulse laser disposed in a laser medium, a peaking capacitor connected in parallel to the discharge electrodes and a series circuit of saturable reactors and transferring capacitors connected in parallel to the peaking capacitor, which transfers electric charges charged in the transferring capacitors to the peaking capacitor by utilizing a magnetic saturation phenomenon of the saturable reactors to cause a pulse discharge between the discharge electrodes and excites the laser medium so to produce the pulse laser, wherein the series circuit of the saturable reactors and the transferring capacitors is connected in a plurality of numbers in parallel to the peaking capacitor, and the plurality of saturable reactors are magnetically coupled, and saturable reactors for finely adjusting a transfer initiation time are connected in series to the plurality of saturable reactors.

According to the invention, the plurality of parallel-connected saturable reactors included in the electric charge transfer circuit in the final stage for the electric charge transfer from the transferring capacitors to the peaking capacitor are magnetically coupled, so that the saturation timing among the plurality of magnetically coupled saturable reactors is the same. Specifically, since the plurality of parallel-connected saturable reactors are magnetically coupled, the saturation timing among the plurality of saturable reactors is the same even if a change in the electric current flowing through the respective saturable reactors is variable to some extent before the saturable reactors are saturated due to various factors of deviations, and the electric charge transfer in the presence of the plurality of saturable reactors can be started at the same time. And, the invention has the saturable reactors for finely adjusting a transfer initiation time connected in series to the plurality of magnetically coupled saturable reactors. The plurality of saturable reactors for finely adjusting a transfer initiation time connected in series are not coupled magnetically.

Therefore, the invention can finely adjust to delay the timing of initiating the electric charge transfer through the plurality of circuit routes from the plurality of transferring capacitors to the peaking capacitor by the saturable reactors for finely adjusting a transfer initiation time, and can finely adjust to extend the electric charge transfer duration through the each circuit route because the inductance of the each circuit route is increased by the plurality of saturable reactors for finely adjusting a transfer initiation time.

Thus, according to the invention, the electric charge transfer initiation timing for the electric charge transfer from the plurality of transferring capacitors to the peaking capacitor is delayed and the electric charge transfer duration can be extended by adjusting, so that the luminescence time of the laser light can be extended, and the luminescence intensity per unit time can de decreased. Therefore, the present invention can obtain the pulse laser light not having an excessively short pulse width and an excessively large peak output by a simple structure. And according to the fifth arrangement of the invention, a saturable reactor having a small inductance for fine adjustment is disposed independent of the magnetically coupled saturable reactors having a large inductance, and the transfer initiation timing and the electric charge transfer duration are adjusted by the finely adjusting saturable reactors, so that adjusting accuracy can be improved better than the adjustment of the saturable reactors having a large inductance.

The invention makes assist times of the plurality of saturable reactors for finely adjusting the transfer initiation time to be different in the fifth arrangement of the invention.

According to the invention, the saturable reactors in the series circuit of the saturable reactors and the transferring capacitors included in the electric charge transfer circuit in the final stage in the magnetic pulse compression circuit are divided into a parallel circuit of the plurality of saturable reactors, the plurality of saturable reactors are magnetically coupled, and the saturable reactors for finely adjusting a transfer initiation time are connected in series to the plurality of magnetically coupled saturable reactors.

In other words, invention has one transferring capacitor.

Therefore, in the same way as in the invention of claim 5, according to the invention, the initiation timing of the electric charge transfer from the plurality of transferring capacitors to the peaking capacitor through the plurality of circuit routes can be finely adjusted to be delayed by the saturable reactor for finely adjusting a transfer initiation time, and the inductance of the each circuit route is increased by the plurality of saturable reactors for finely adjusting a transfer initiation time, so that the fine adjustment can be made to extend the electric charge transfer duration through the each circuit route. Thus, the present invention can extend the luminescence time of the laser light and decrease the luminescence intensity per unit time. And, this invention adjusts the transfer initiation timing and the electric charge transfer duration by the finely adjusting saturable reactors, so that the adjusting accuracy can be improved better than adjusting the saturable reactors having a large inductance.

The invention relates to a power supply unit for a pulse laser comprising: discharge electrodes for a pulse laser disposed in a laser medium; a peaking capacitor connected in parallel to the discharge electrodes; an electric charge transfer circuit in a final stage which has a plurality of series circuits connected in parallel to the peaking capacitor and comprised of a plurality of first capacitors and a plurality of saturable reactors for finely adjusting a transfer initiation time; and an electric charge transfer circuit in a stage before the final stage by one which has a plurality of series circuits comprised of a plurality of second capacitors and a plurality of saturable reactors connected to each of the plurality of first capacitors, the power supply unit causing a pulse discharge between the discharge electrodes by transferring the electric charge charged in the plurality of second capacitors to the peaking capacitor through the plurality of first capacitors by using a magnetic saturation phenomenon of the saturable reactors and excites the laser medium so to produce the pulse laser, wherein the plurality of saturable reactors in the electric charge transfer circuit in the stage before the final stage by one are magnetically coupled, and saturation timings of the plurality of saturable reactors for finely adjusting the transfer initiation time included in the electric charge transfer circuit in the final stage are made different.

According to the invention, the electric charge transfer circuit in the stage before the final stage by one connects a plurality of series circuits of the saturable reactors and the second capacitors in parallel and magnetically couples the plurality of saturable reactors. The electric charge transfer circuit in the final stage has a plurality of series circuits of the saturable reactors for finely adjusting a transfer initiation time and the first capacitors connected in parallel to the peaking capacitor. And, the saturation timing is different among the plurality of saturable reactors for finely adjusting a transfer time included in the electric charge transfer circuit in the final stage. In other words, the invention adds the electric charge transfer circuit, which has the plurality of series circuits of the saturable reactors for finely adjusting a transfer initiation time and the first capacitors connected in parallel, to the final stage so to have a different electric charge transfer initiation timing among the plurality of electric charge transfer routes to the peaking capacitor. Namely, the electric charge transfer initiation timing is made same among the respective stages before the final stage by one by magnetically coupling the plurality of saturable reactors, and the electric charge initiation timing is made different among the respective electric charge transfer routes in the final stage.

As described above, this invention transfers the electric charge to the peaking capacitor through the plurality of circuit routes with different initiation timings, so that the peaking capacitor is charged relatively slowly as compared with a case of transferring the electric charge by one operation. Therefore, the luminescence duration of the laser light can be extended, and the luminescence intensity per unit time can be decreased. And, there is caused a phenomenon of transferring the electric charge to the peaking capacitor through the other circuit routes while the laser light is emitted after the initiation of discharge, and the luminescence duration of the laser light can be extended.

The invention relates to a power supply unit for a pulse laser comprising: discharge electrodes for a pulse laser disposed in a laser medium; a peaking capacitor connected in parallel to the discharge electrodes; an electric charge transfer circuit in a final stage which has a plurality of series circuits connected in parallel to the peaking capacitor and comprised of a plurality of first capacitors and a plurality of saturable reactors for finely adjusting a transfer initiation time; and an electric charge transfer circuit in a stage before the final stage by one which has a plurality of saturable reactors connected in series to each of the plurality of first capacitors and a single second capacitor connected in parallel to the plurality of saturable reactors, the power supply unit causing a pulse discharge between the discharge electrodes by transferring the electric charge charged in the second capacitor to the peaking capacitor through the plurality of first capacitors by using a magnetic saturation phenomenon of the saturable reactors and exciting the laser medium so to produce the pulse laser, wherein the plurality of saturable reactors in the electric charge transfer circuit in the stage before the final stage by one are magnetically coupled, and saturation timings of the plurality of saturable reactors for finely adjusting the transfer initiation time included in the electric charge transfer circuit in the final stage are made different.

According to the invention, the electric charge transfer circuit in the stage before the final stage by one comprises the single second capacitor and the plurality of saturable reactors connected in parallel to the second capacitor. And, the electric charge transfer circuit in the final stage connects the series circuit of the saturable reactors for finely adjusting a transfer initiation time and the first capacitor in a plurality of numbers in parallel to the peaking capacitor. And, the saturation timing is made different among the plurality of saturable reactors for finely adjusting a transfer time included in the electric charge transfer circuit in the final stage.

The invention adds the electric charge transfer circuit, which has the plurality of series circuits of the saturable reactors for finely adjusting a transfer initiation time and the first capacitors connected in parallel, to the final stage so to have different electric charge transfer initiation timings among the plurality of electric charge transfer routes to the peaking capacitor. Namely, the invention of claim 16 is different from the invention of claim 13 on the point that one capacitor is included in the electric charge transfer circuit in the stage before the final stage by one.

Therefore, the invention magnetically couples the plurality of saturable reactors in the stage before the final stage by one to have the same electric charge transfer initiation timing in the stage before the final stage by one, thereby having a different electric charge transfer initiation timing for each electric charge transfer route in the final stage.

In the invention, the electric charges are transferred with different initiation timings to the peaking capacitor through the plurality of circuit routes. Thus, the peaking capacitor is charged relatively slowly as compared with a case of transferring the electric charges by one operation. Therefore, the luminescence duration of the laser light can be extended, and the luminescence intensity per unit time can be decreased. And, there is caused a phenomenon of transferring the electric charge to the peaking capacitor through the other circuit routes while the laser light is emitted after the initiation of discharge, and the luminescence duration of the laser light can be extended.

DESCRIPTION OF THE PREFERRED EMBODIMENTS

Preferred embodiments of the present invention will be described in detail with reference to the accompanying drawings.

Figure 1:
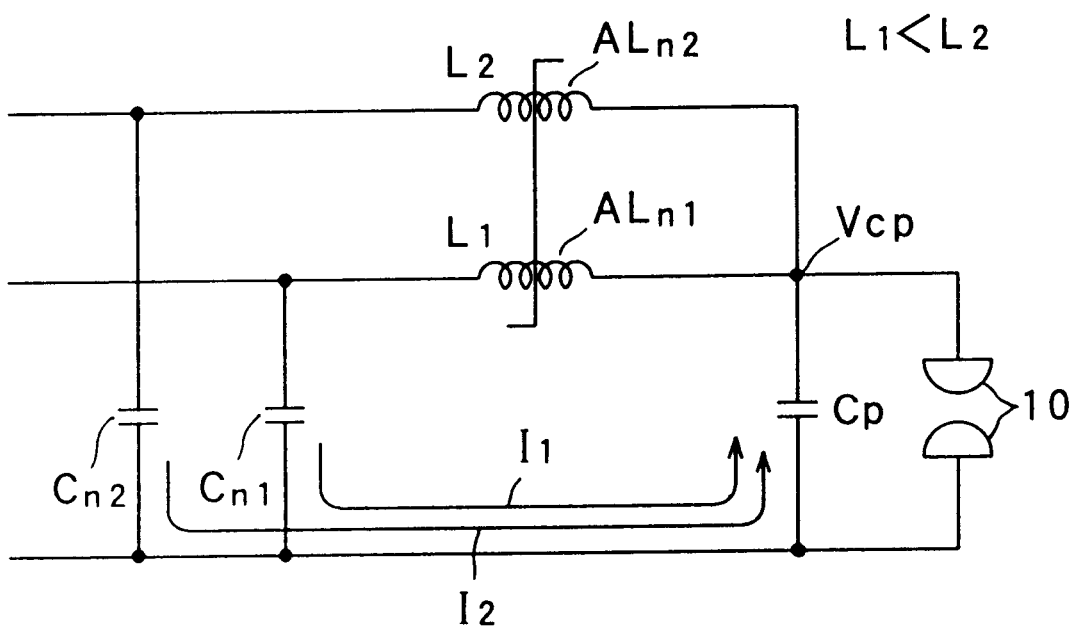
FIG. 1 is an equivalent circuit diagram showing an embodiment of the present invention.

FIG. 1 is an equivalent circuit diagram showing an embodiment of the present invention. FIG. 1 shows a compression circuit only in a final stage of a magnetic pulse compression circuit. This magnetic pulse compression circuit is used, for example, as a power circuit to apply a high voltage to the electrical discharge electrode of a pulse gas laser such as an excimer laser.

In this embodiment, discharge electrodes 10 have peaking capacitor Cp connected in parallel. A series circuit of saturable reactor ALn1 and transferring capacitor Cn1 and a series circuit of saturable reactor ALn2 and transferring capacitor Cn2 are connected in parallel to the peaking capacitor Cp. These two transferring capacitors Cn1 and Cn2 transfer an electric charge to the peaking capacitor Cp and also receive an electric charge from unillustrated capacitors in the previous stage. In other words, voltages of the transferring capacitors Cn1 and Cn2 change quite similarly. The transfer capacitors Cn1 and Cn2 have the same capacitance.

On the other hand, the two parallel-connected saturable reactors ALn1 and ALn2 are magnetically coupled tightly and have the same saturation timing.

Figure 2:
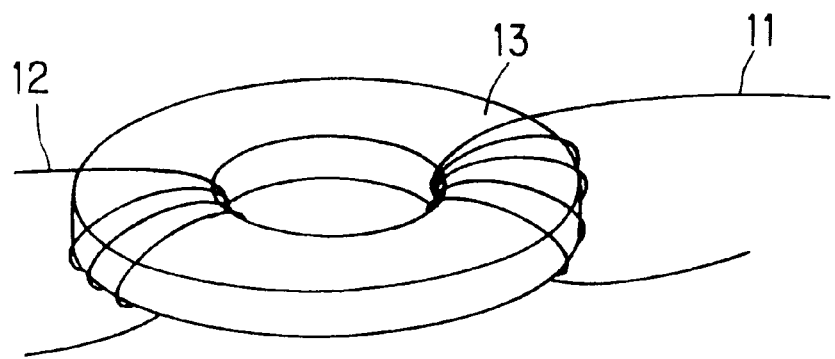
FIG. 2 is a diagram showing one technique of magnetic coupling.

As a technique of magnetic coupling, individual windings 11 and 12 of the two saturable reactors ALn1 and ALn2 are, for example, wound around one common core 13 as shown in FIG. 2.

In the saturable reactors, even if a voltage is applied to the saturable reactors, the windings have also a sufficiently large inductance because the core first has very high magnetic permeability. Therefore, an electric current flowing through the windings increases very slowly. When the magnetic flux produced by the electric current exceeds the saturation magnetic flux density in the core, the core is saturated. Then, the magnetic permeability of the core becomes small suddenly, and the current flowing through the windings increases suddenly. This is the time when the saturable reactors are saturated (the time of turning on).

In this embodiment, the same core 13 is used to configure a plurality of saturable reactors in the same stage. Even if the currents which flow through the windings 11 and 12 are somewhat different until the core is saturated due to various types of variations, the saturation timing of the plurality of saturable reactors in the same stage coincides, and the transfer of electric charges through the mediation of the saturable reactors ALn1 and ALn2 can be started at the same time.

Figure 3:
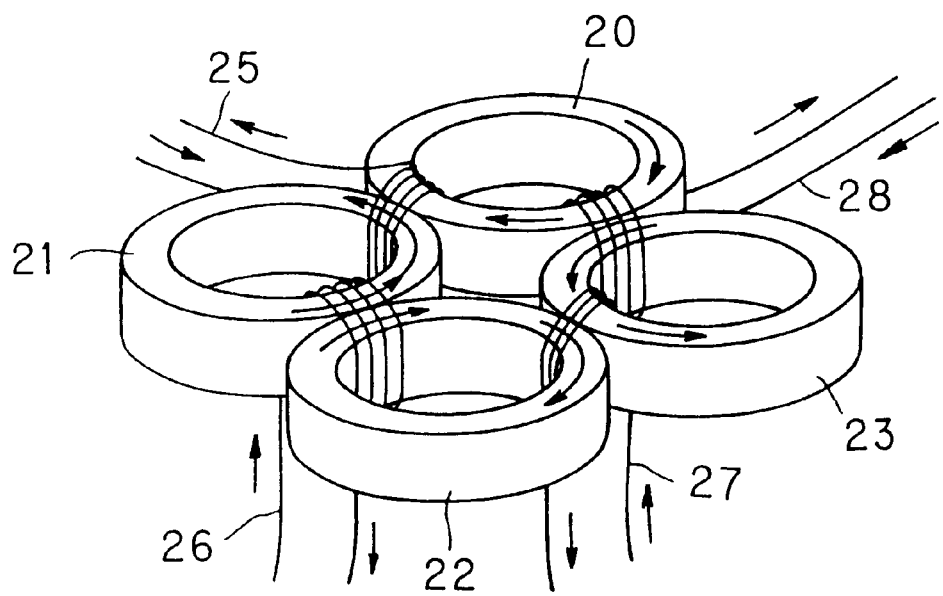
FIG. 3 is a diagram showing another technique of magnetic coupling.

Another method for the magnetic coupling is shown in FIG. 3.

FIG. 3 shows that four saturable reactors are magnetically coupled. Specifically, a plurality (four here) of cores 20 to 23 are used, and windings 25 to 28 of respective saturable reactors are wound around two cores.

Among arrows shown in FIG. 3, those in parallel to the windings indicate directions of an electric current, and those indicated in the cores 20 to 23 indicate directions of magnetic fields produced by the respective windings. It is necessary to adjust the direction of winding the coils and the direction of the electric current so that the directions of the magnetic fields become alternately opposite in counterclockwise→clockwise→counterclockwise directions for every core. To achieve the magnetic fields in the opposite direction for every core, the cores should be used in an even number.

In FIG. 3, when a voltage is applied to the windings 25 to 28, the voltage is generated in the respective cores 20 to 23 to cancel the current which flows through the respective windings so to suppress the increase of the current. Because the individual cores 20 to 23 have a very high magnetic permeability first, the windings have also a sufficiently high inductance, and the electric current flowing through the windings increases extremely slowly. With the increase of the electric current, the magnetic flux densities of the cores 20 to 23 also increase to get close to saturation in the same way. And, when the magnetic flux produced by the electric current exceeds the saturation magnetic flux density in the cores, the cores are saturated.

If one core 20 saturates, the electric currents flowing through the windings 25 and 28 wound around the core 20 increase sharply. With the increase of the electric currents, the magnetic flux densities of the cores 21 and 23 adjacent to the core 20 also increase suddenly, and the cores 21 and 23 also saturate immediately.

As a result, the electric currents flowing through the windings 26 and 27 wound around the cores 21 and 23 increase suddenly.

Then, the remaining core 22 saturates immediately with the increase of the electric currents.

Thus, whichever core is saturated first among the four cores with the increase of the electric currents, the remaining three cores are saturated immediately, and it becomes possible to match the saturation timings among the four saturable reactors.

The two saturable reactors ALn1, ALn2 which are magnetically coupled in FIG. 1 are designed to have different post-saturation inductances L1, L2. In this case, L1 is smaller than L2 (L1<L2).

In the circuit shown in FIG. 1, the transferring capacitors Cn1 and Cn2 have the same capacity, and both voltages of the transferring capacitors Cn1 and Cn2 change substantially in the same way. Moreover, saturation characteristics of the saturable reactors ALn1 and ALn2 are determined so that the saturable reactors ALn1 and ALn2 are saturated with volt-time products having the same value.

Therefore, the saturable reactors ALn1 and ALn2 are basically saturated simultaneously. Besides, since the saturable reactors ALn1 and ALn2 are magnetically coupled by the above-mentioned technique, the saturation timings of the saturable reactors ALn1 and ALn2 coincide even if the electric currents flowing through the saturable reactors ALn1, ALn2 change with some variations. Thus, the start of transferring the electric charge from the transferring capacitor Cn1 to the peaking capacitor Cp can be matched substantially perfectly with the start of transferring the electric charge from the transferring capacitor Cn2 to the peaking capacitor Cp.

In the circuit shown in FIG. 1, post-saturation inductance L2 of the saturable reactor Ln2 is set to be lager than post-saturation inductance L1 of the saturable reactor ALn1. In this case, transfer time $\tau 2$ of electric charge I2 transferred from the transferring capacitor Cn2 to the peaking capacitor Cp through the saturable reactor ALn2 is longer than transfer time $\tau 1$ of electric charge I1 transferred from the transferring capacitor Cn1 to the peaking capacitor Cp through the saturable reactor ALn1.

Figure 4:
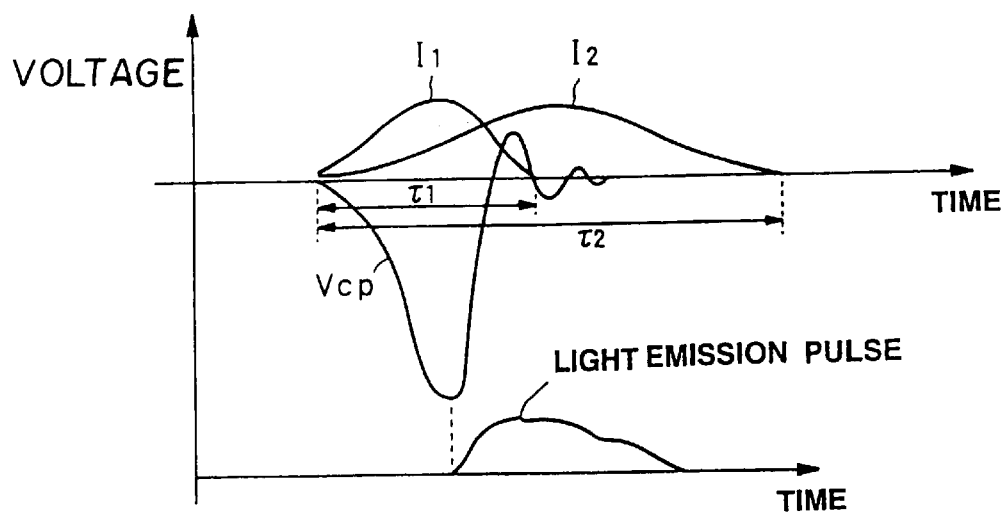
FIG. 4 is a time chart of an electric current, a voltage, etc. of the embodiment shown in FIG. 1.

Thus, in the circuit of FIG. 1, current pulse I1 transferred in a short time and current pulse I2 transferred over a relatively long time can be generated by having the same transfer initiation timing as shown in FIG. 4.

In this embodiment, voltage Vcp of the peaking capacitor Cp increases with the progress of charging with a combined current of the current I1 and the current I2 as shown in FIG. 4.

And, when the voltage Vcp reaches a predetermined main discharge initiation voltage, the laser gas between the main electrodes 10 is dielectrically broken down to initiate the electric discharge. This main discharge excites the laser medium to produce the laser light. Then, the voltage of the peaking capacitor Cp drops immediately by the main discharge and returns to the state before the initiation of charging after the resonance.

Here, the current pulse I2 transferred over a long time is continuously transferred to the peaking capacitor Cp even while the laser light is being emitted after the initiation of the laser oscillation. Therefore, in the circuit of FIG. 1, the state of supplying the energy to the peaking capacitor Cp can be produced even after producing the laser light, so that the luminescence time of the laser light can be extended, and the luminescence intensity per unit time can be decreased.

Figure 5:
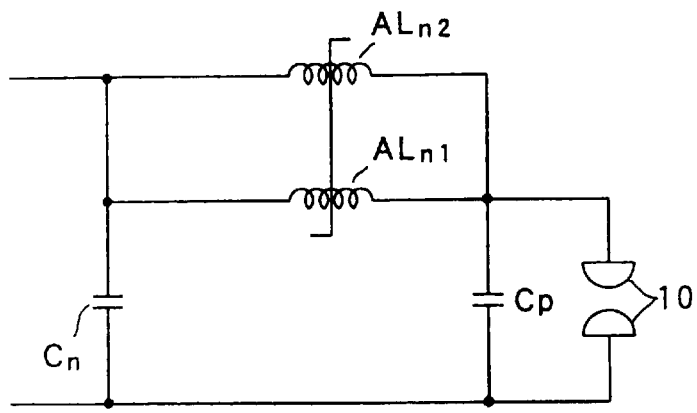
FIG. 5 is an equivalent circuit diagram showing another embodiment of the present invention.

FIG. 5 shows another embodiment of the present invention. In this embodiment, only two saturable reactors ALn1, ALn2 in the electric charge transferring circuit in the final stage are connected in parallel to the peaking capacitor Cp, and the transferring capacitor Cn is remained single in the same way as before.

In this embodiment, the two parallel-connected saturable reactors ALn1, ALn2 are magnetically coupled in the same way as in the previous embodiment, and the post-saturation inductances L1, L2 of the two saturable reactors ALn1, ALn2 are set to different values. Therefore, the transfer of the electric charge through two routes from the transferring capacitor Cn to the peaking capacitor Cp via the two saturable reactors ALn1, ALn2 is also started at the same time in this embodiment, and the electric charge transfer durations of the two routes have different values.

Therefore, this embodiment can also produce substantially the same electric charge transferring state as in the one shown in FIG. 4. Thus, the laser light emission time can be extended, and the luminescence intensity per unit time can be lowered.

Figure 6:
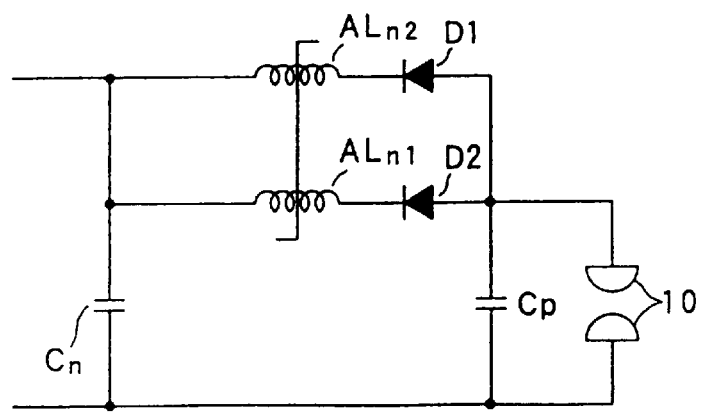
FIG. 6 is an equivalent circuit diagram showing another embodiment of the present invention.

FIG. 6 shows another embodiment of the present invention.

Figure 20:
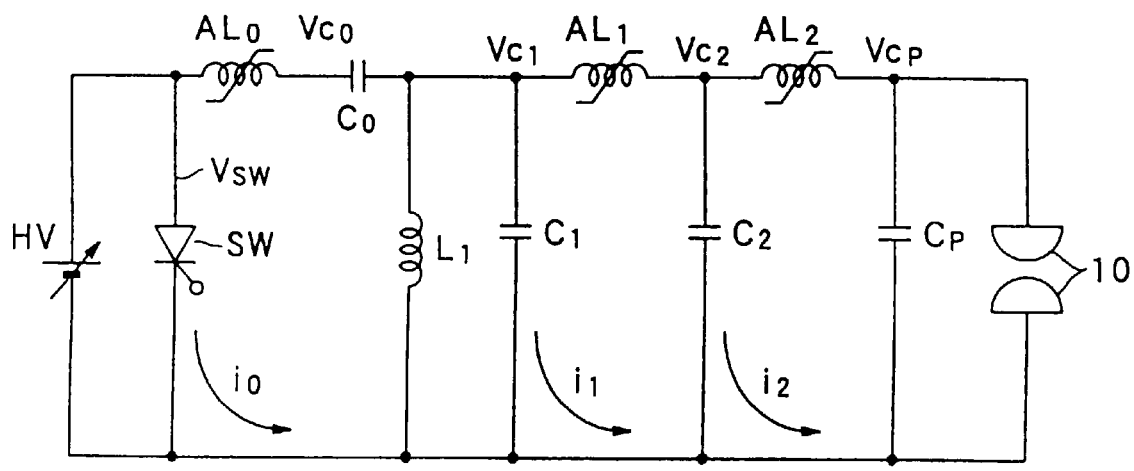
FIG. 20 is an equivalent circuit diagram showing a conventional technology.
Figure 21:
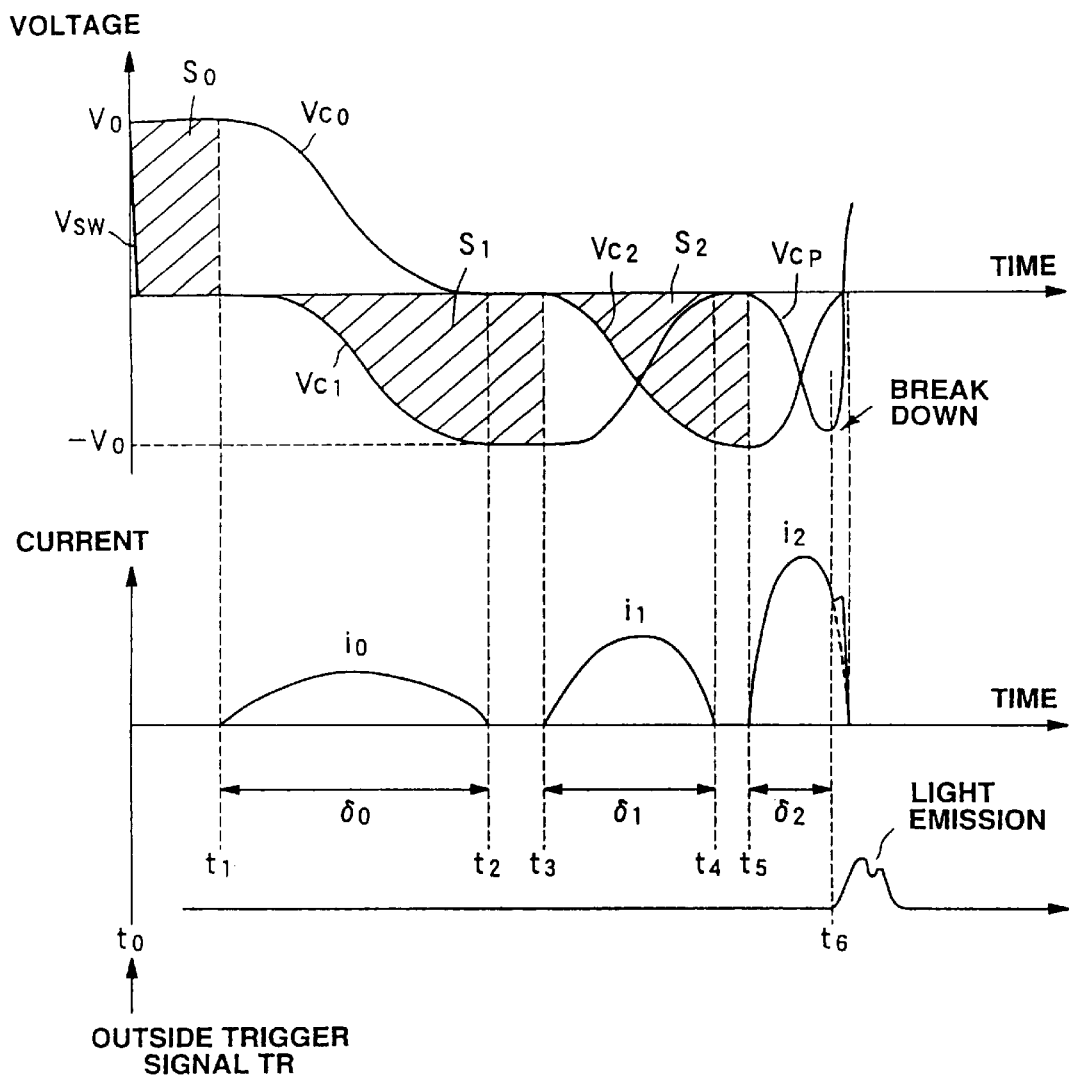
FIG. 21 is a time chart of an electric current, a voltage, etc. of a conventional technology.

In this embodiment, diodes D1, D2 which are connected in series to the respective saturable reactors ALn1, ALn2 are added to the circuit shown in FIG. 5. The method of transferring the electric charge in the embodiment shown in FIG. 1 or FIG. 5 is the same as shown in FIG. 20, but the circuit of FIG. 6 utilizes a method of transferring the electric charge different from FIG. 20. Therefore, a basic electric charge transfer operation of the circuit shown in FIG. 6 will be described with reference to FIG. 7 and FIG. 8.

Figure 7:
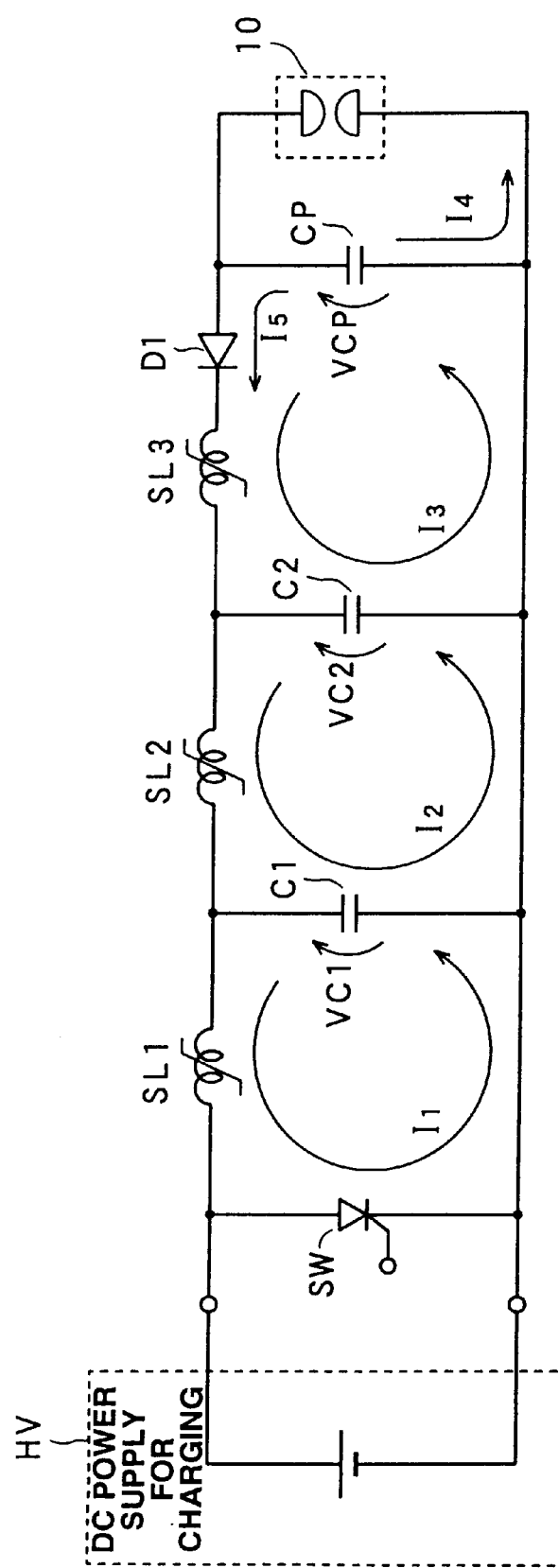
FIG. 7 is an equivalent circuit diagram for illustrating an electric charge transfer operation in the embodiment of FIG. 6.

In FIG. 7, the saturable reactors and the capacitors of the LC circuit in the final stage are not divided into a plurality of parallel circuits.

In the magnetic pulse compression circuit shown in FIG. 7, switching device SW and saturable reactor SL1 and capacitor C1 connected in series are respectively connected in parallel to direct-current power supply HV for charging. Saturable reactor SL2 and capacitor C2 which are connected in series are connected in parallel to the capacitor C1. Saturable reactor SL3, diode D1 and peaking capacitor Cp which are connected in series are connected in parallel to the capacitor 2. And, laser discharge section 10 is connected in parallel to the peaking capacitor Cp. In this case, the diode D1 has a conduction direction from the peaking capacitor Cp to the saturable reactor SL3. In other words, the diode D1 has a conduction direction in the direction of transferring energy at the time of the pulse compression transfer.

An operation of the magnetic pulse compression circuit of FIG. 7 will be described with reference to a time chart of FIG. 8.

In FIG. 7, the capacitor C1 and the capacitor C2 are charged with a DC high voltage applied by the DC power supply HV for charging. The capacitor C1 is charged via the saturable reactor SL1, and the capacitor C2 is charged via the saturable reactors SL1, SL2. This charging can be achieved by applying a high DC voltage over plenty of time even if the saturable reactors SL1, SL2 do not saturate. This is because the inductance becomes small when the current does not change suddenly. On the other hand, the peaking capacitor Cp is not charged, because the electric charge is prevented from moving to the peaking capacitor Cp by the diode D1.

Figure 8:
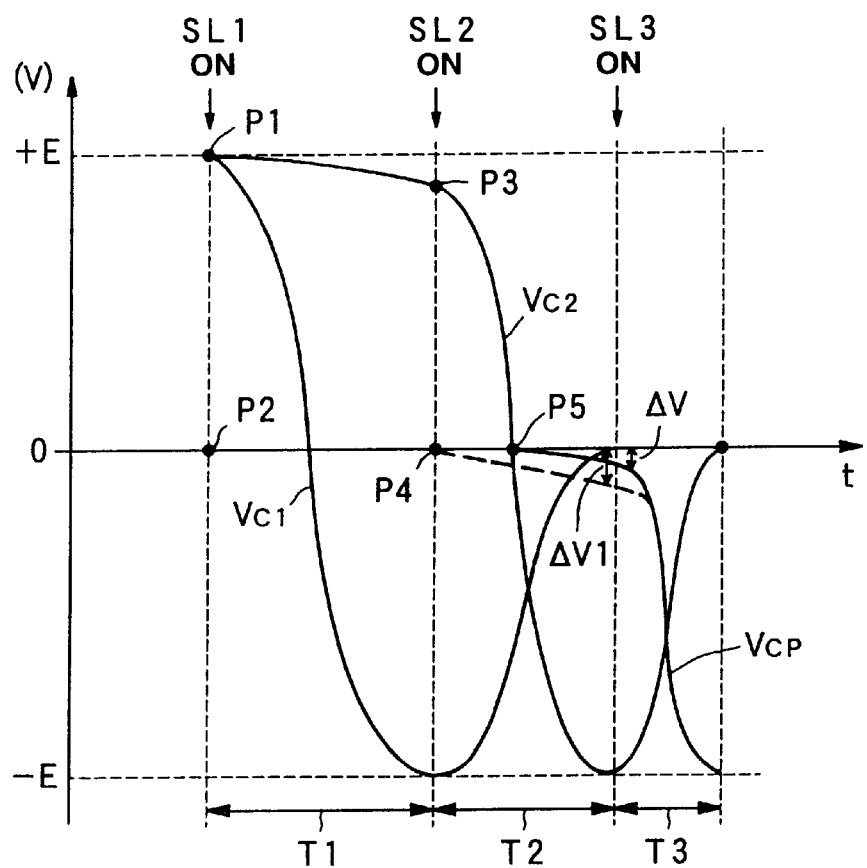
FIG. 8 is a time chart showing voltage waveforms at respective points of the circuit of FIG. 7.

Therefore, terminal voltages VC1, VC2 of the capacitors C1, C2 in the stage that the charging has completed as shown in FIG. 8 are respectively +E volt (point P1), and terminal voltage Vcp of the peaking capacitor Cp is 0 volt (point P2).

Then, when the main switch SW is turned on, the electric charges accumulated in the capacitor C1 are started to be transferred. In other words, the terminal voltage of the saturable reactor SL1 is increased sharply when the switching device SW is turned on, and when its volt-time product reaches a saturation limit of the saturable reactor SL1, the saturable reactor SL1 is saturated, and the inductance of the saturable reactor SL1 is decreased suddenly, falling in an on state.

As a result, the electric charge accumulated in the capacitor C1 flows as electric current I1, and the polarity of the capacity C1 is reversed. In other words, the terminal voltage VC1 of the capacitor C1 changes from +E volt to -E volt as shown in FIG. 8. During period T1 in which the polarity of the capacitor C1 is reversed, the electric charge accumulated in the capacitor C2 is discharged through the saturable reactor SL1 although the saturable reactor SL2 is in an off state due to the voltage drop between the saturable reactors SL1 and SL2 and also discharged through the capacitor C2, the reactor SL2 and the capacitor C1 to cause a small voltage drop (point P3).

Then, the saturable reactor SL2 is turned on immediately after the completion of the electric charge transfer by the reversing of the polarity of the capacitor C1, and the electric charge, which is transferred by the reversing of the polarity and accumulated in the capacitor C1, and the electric charge, which is accumulated in the capacitor C2, flow as electric current I2 to reverse the polarity of the capacitor C2, and the electric charge of the capacitor C1 is transferred to the capacitor C2. When the capacitor C1 and the capacitor C2 are in a capacitance ratio of 3:1, the terminal voltage VC1 of the capacitor C1 changes from -E volt to 0 volt as shown in FIG. 8, and the terminal voltage VC2 of the capacitor C2 changes from substantially +E volt to -E volt. During period T2 in which the electric charge is transferred from the capacitor C1 to the capacitor C2 and the polarity of the capacitor C2 is reversed, the electric charge of the peaking capacitor Cp leaks through the diode D1 and the saturable reactor SL3. But, when the saturable reactor SL2 is turned on, the potential of the saturable reactor SL2 is higher than the potential of the saturable reactor SL3, so that the electric charge of the peaking capacitor Cp does not leak. And, the electric charge of the peaking capacitor Cp starts to leak from point P5 when the saturable reactor SL2 and the saturable reactor SL3 have the same potential. As a result, a value of voltage drop ΔV of the terminal voltage Vcp due to the leaked electric charge of the peaking capacitor Cp is a half or much smaller value as compared with a value of voltage drop ΔV1 where the electric charge starts to leak from point P4 when the saturable reactor SL2 is turned on. Thus, a value of the terminal voltage Vcp of the peaking capacitor Cp before the transfer of the electric charge to the peaking capacitor Cp is effectively suppressed to close to 0 volt.

Here, where the laser oscillation output from the laser discharge section 10 is to be controlled, the voltage applied to the laser discharge section 10 is controlled, but according to the electric charge transfer method shown in FIG. 7, an amount of energy such as an applied voltage amount and electric charge amount supplied from the peaking capacitor Cp to the laser discharge section 10 can be known accurately, and stable pulse laser output with high accuracy can be controlled.

Then, the saturable reactor SL3 is turned on immediately after the completion of the transfer of the electric charge to the capacitor C2 to flow the electric charge accumulated in the capacitor C2 as electric current I3, and the electric charge of the capacitor C2 is transferred to the peaking capacitor Cp. The electric charge transferred to the peaking capacitor Cp is applied as electric current I4 to the laser discharge section 10, the laser medium is excited by the discharge of the laser discharge section 10 to conduct laser oscillation. The current remained other than the current consumed in the laser discharge section 10 is then oscillated several times between the laser discharge section 10 and the peaking capacitor Cp, but when the switching device SW is off, it is regenerated as electric current I5 to the capacitors C1 and C2 through the diode D1 and the saturable reactors SL2, SL3 every time the current is oscillated. Besides, the electric charge regenerated to the capacitors C1, C2 through the diode D1 by the rectification action of the diode D1 is prevented from returning to the peaking capacitor Cp. Thus, the electric charge transferred to the peaking capacitor Cp contributes for the electric discharge of the laser discharge section 10, and the remained electric charge is regenerated again to the capacitors C1, C2, so that the next charging energy can be decreased, and the energy consumption efficiency can be enhanced greatly.

In the circuit shown in FIG. 6, the saturable reactors ALn1, ALn2 contained in the electric charge transfer circuit in the final stage to perform the electric charge transfer from the capacitor C1 (Cn in FIG. 6) to the peaking capacitor Cp are connected in parallel in multiple numbers to the magnetic pulse compression circuit for the electric charge transfer as shown in FIG. 7, the plurality of saturable reactors ALn1, ALn2 are magnetically coupled, and the diodes D1, D2 are connected in series to these saturable reactors. Specifically, the two saturable reactors ALn1, ALn2 connected in parallel to the capacitor Cn in FIG. 6 are also magnetically coupled in the same way as in the embodiment of FIG. 5, and the post-saturation inductances L1, L2 of the two saturable reactors ALn1, ALn2 are set to different values. Therefore, the electric charge transfer from the transferring capacitor Cn to the peaking capacitor Cp through two routes via the two saturable reactors ALn1, ALn2 is also started at the same time in this embodiment, and the electric charge transferring duration has a different value between the two routes. Thus, this embodiment can also produce substantially the same electric charge transferring state as in FIG. 4, so that the luminescence time of the laser light can be extended, and the luminescence intensity per unit time can be decreased.

And, in the embodiment of FIG. 6, the same electric charge transfer is performed as in the circuit shown in FIG. 7, and the diodes D1, D2 are connected in series to the plurality of saturable reactors ALn1, ALn2 included in the electric charge transfer circuit in the final stage. Therefore, the same effect as the circuit shown in FIG. 7 can also be obtained by this embodiment.

Figure 9:
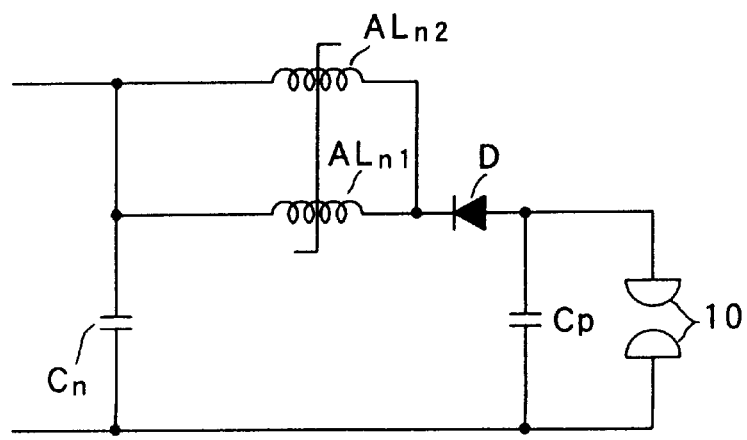
FIG. 9 is an equivalent circuit diagram showing a modification of the embodiment of FIG. 6.

The diodes connected to the electric charge transfer circuit in the final stage may be a single diode D which is commonly connected to the plurality of parallel-connected saturable reactors ALn1, ALn2 as shown in FIG. 9. Thus, the same effect as in the embodiment of FIG. 6 can be obtained.

Figure 10:
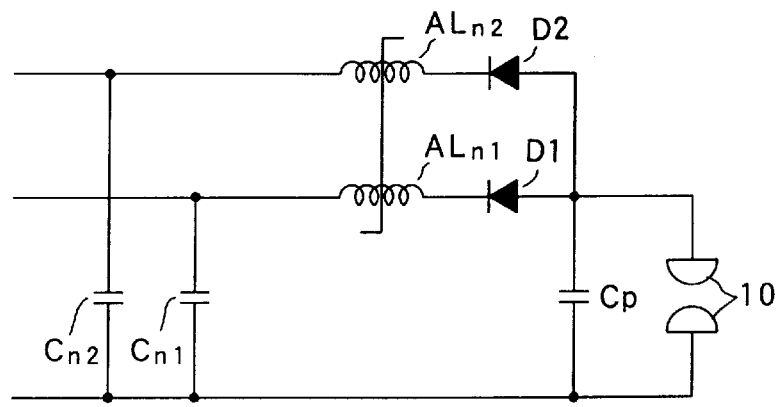
FIG. 10 is an equivalent circuit diagram showing another embodiment of the present invention.

FIG. 10 shows still another embodiment of the present invention.

In this embodiment, diodes D1, D2 which are connected in series to the individual saturable reactors ALn1, ALn2 are added to the circuit shown in FIG. 1. A method of transferring the electric charge in the embodiment of FIG. 10 is the same as in FIG. 7.

In this embodiment, the two saturable reactors ALn1, ALn2 are magnetically coupled in the same way as in the previous embodiment, and post-saturation inductances L1, L2 of the two saturable reactors ALn1, ALn2 are set to different values. Therefore, the electric charge transfer is simultaneously started from the transferring capacitor Cn to the peaking capacitor Cp through two routes via the two saturable reactors ALn1, ALn2 in this embodiment, and the electric charge transfer duration has a different value between the two routes. Accordingly, this embodiment can also provide substantially the same electric charge transfer state as shown in FIG. 4, thereby enabling to extend the luminescence duration of the laser light and to decrease the luminescence intensity per unit time.

And, in the embodiment of FIG. 10, the same electric charge transfer as in the circuit shown in FIG. 7 is performed, and diodes D1, D2 are connected in series to a plurality of saturable reactors ALn1, ALn2 included in the electric charge transfer circuit in the final stage. Therefore, this embodiment can provide the same effect as the circuit shown in FIG. 7.

Figure 11:
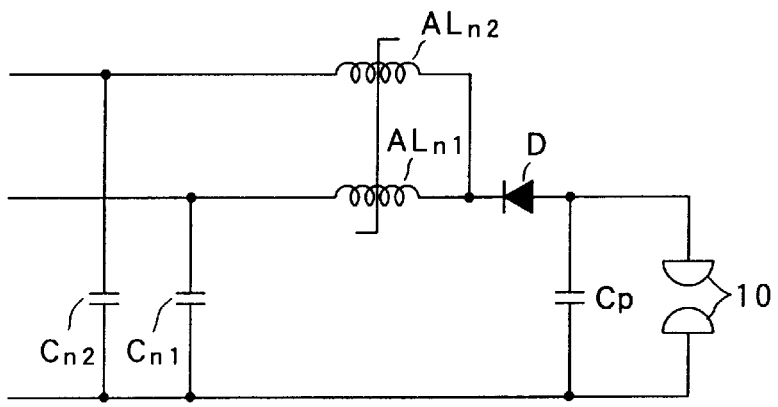
FIG. 11 is an equivalent circuit diagram showing a modification of the embodiment of FIG. 10.

In the circuit shown in FIG. 10, the diodes connected to the electric charge transfer circuit in the final stage may be modified so that one diode D1 is commonly connected to the plurality of parallel-connected saturable reactors ALn1, ALn2 as shown in FIG. 11. In this way, the same effect as in the embodiment of FIG. 10 can also be obtained.

Figure 12:
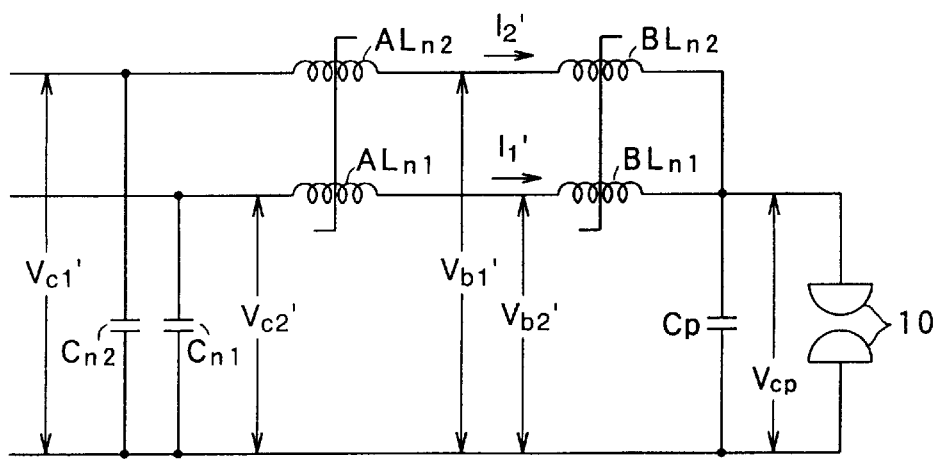
FIG. 12 is an equivalent circuit diagram showing an embodiment of the present invention.

FIG. 12 is an equivalent circuit diagram showing one embodiment of the present invention. In FIG. 12, like reference numerals designate like component elements as in FIG. 1, and their description is omitted.

In this embodiment, a series circuit of saturable reactor ALn1, saturable reactor for finely adjusting transfer time (hereinafter simply called the finely adjusting saturable reactor) BLn1 and transferring capacitor Cn1 and a series circuit of saturable reactor ALn1, finely adjusting saturable reactor BLn2 and transferring reactor Cn2 are connected in parallel to peaking capacitor Cp.

In FIG. 12, the finely adjusting saturable reactors BLn1, BLn2 are connected in series to the two magnetically coupled saturable reactors ALn1, ALn2. These finely adjusting saturable reactors BLn1, BLn2 are not coupled magnetically.

Specifically, adjusting accuracy is improved by using post-saturation inductances of the finely adjusting saturable reactors BLn1, BLn2 smaller than those of the two magnetically coupled saturable reactors ALn1, ALn2 and adjusting the inductances of the finely adjusting saturable reactors BLn1, BLn2. In other words, the adjustment accuracy is improved not by adjusting the inductances of the saturable reactors ALn1, ALn2 having a high inductance but by adjusting the inductances of the separately disposed finely adjusting saturable reactors BLn1, BLn2.

(1) Here, as a first example of the circuit shown in FIG. 12, the two saturable reactors BLn1, BLn2 are set to have different assist times (i.e., the time required from the start of applying a voltage to the saturable reactors to the saturation of the saturable reactors). And, the post-saturation inductance has the same value between the two magnetically coupled saturable reactors ALn1, ALn2.

Figure 13A:
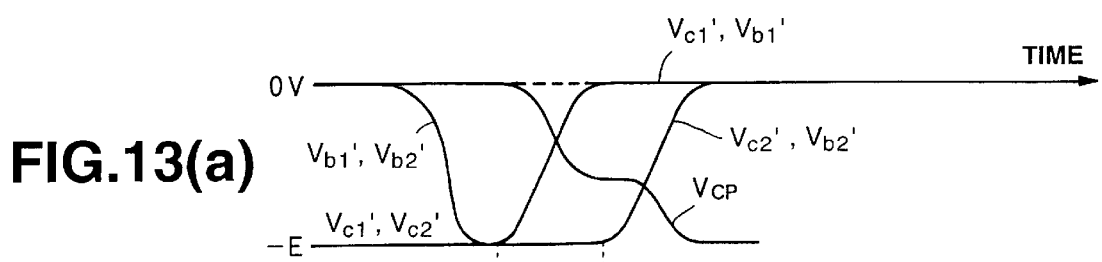
FIGS. 13(*a*) and 13(*b*) are a time chart of a current voltage of a first example of the embodiment of FIG. 12.
Figure 13B:
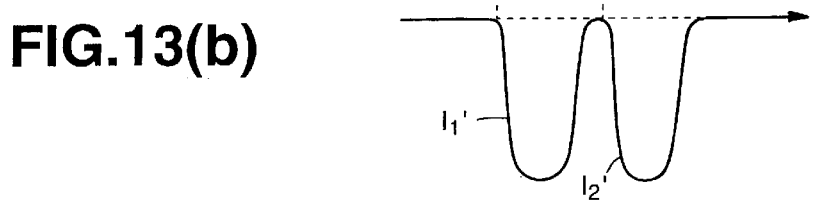

By setting as described above, the electric charge transfer is performed from the transferring capacitors Cn1, Cn2 to the peaking capacitor Cp as shown in FIGS. 13(a) and 13(b). In FIGS. 13(a) and 13(b), Vc1' denotes a voltage of the transferring capacitor Cn1, Vc2' denotes a voltage of the transferring capacitor Cn2, Vb1' denotes a terminal voltage of the finely adjusting saturable reactor BLn1, Vb2' denotes a terminal voltage of the finely adjusting saturable reactor BLn2, and Vcp denotes a voltage of the peaking capacitor Cp. And, electric current pulse I1' denotes a transfer current from the transferring capacitor Cn1 to the peaking capacitor Cp, and electric current pulse I2' denotes a transfer current from the transferring capacitor Cn2 to the peaking capacitor Cp.

In the initial state of the time axis in FIGS. 13(a) and 13(b), the two magnetically coupled saturable reactors ALn1, ALn2 have already saturated as seen from the states of the voltages Vc1', Vc2'. It is not shown in this waveform diagram, but the saturable reactors ALn1, ALn2 are magnetically coupled, so that they have the same saturation timing. Since the saturable reactors ALn1, ALn2 have the same post-saturation inductance, the voltages Vc1', Vc2' change similarly until the finely adjusting saturable reactors BLn1, BLn2 saturate.

After the magnetically coupled saturable reactors ALn1, ALn2 have saturated, the voltages Vb1', Vb2' of the finely adjusting saturable reactors BLn1, BLn2 change from 0 volt to −E volt. In this case, the saturation characteristics of the saturable reactors BLn1, BLn2 are determined so that the finely adjusting saturable reactor BLn1 has a shorter assist time than that of the finely adjusting saturable reactor BLn2. Therefore, the finely adjusting saturable reactor BLn1 is saturated first, and the electric charge of the transferring capacitor Cn1 is transferred as the current pulse I1 to the peaking capacitor Cp.

After that, when a volt-time product applied to the finely adjusting saturable reactor BLn2 reaches a saturation limit of the saturable reactor BLn2, the saturable reactor BLn2 reaches the saturation, and at this time, the electric charge of the transferring capacitor Cn2 is transferred as the electric pulse I2 to the peaking capacitor Cp.

Then, the voltage Vcp of the peaking capacitor Cp increases to reach a predetermined discharge start voltage, then the laser gas between the main electrodes 10 is dielectrically broken down to start the discharge. This discharge excites the laser medium to produce a laser light.

Thus, in the first example, the plurality of finely adjusting saturable reactors BLn1, BLn2 are determined to have different assist times, so that their saturation timings are different. Thus, timings of starting the electric charge transfer from the transferring capacitors Cn1, Cn2 to the peaking capacitor Cp are different. Therefore, the electric charge is transferred with different start timings to the peaking capacitor Cp through the plurality of circuit routes. Accordingly, the peaking capacitor Cp is charged over a relatively long time as shown in FIG. 13.

Thus, there is caused a phenomenon that the electric charge is transferred to the peaking capacitor even while the laser light is emitted after starting the discharge. Thus, the luminescence time of the laser light can be extended, and its luminescence intensity per unit time can be decreased.

(2) As a second example in the circuit shown in FIG. 12, the post-saturation inductances La1, La2 of the two magnetically coupled saturable reactors ALn1, ALn2 are different. For example, La1 is smaller than La2 (La1<La2). But, the two finely adjusting saturable reactors BLn1, BLn2 have the same assist time. Namely, the finely adjusting saturable reactors BLn1, BLn2 have the same saturation timing.

Figure 14A:
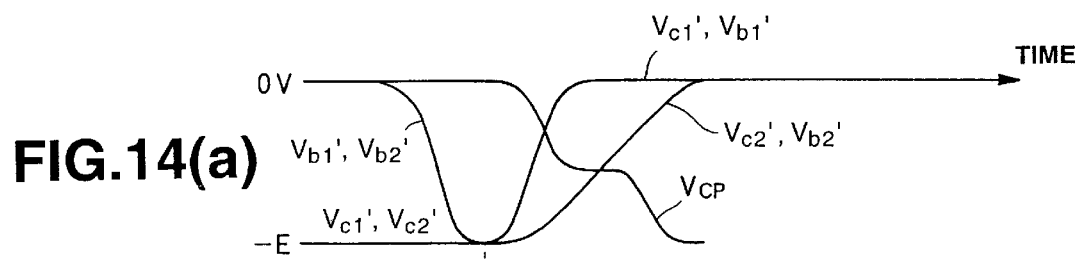
FIGS. 14(*a*) and 14(*b*) are a time chart of a current voltage of a second example of the embodiment of the FIG. 12.
Figure 14B:
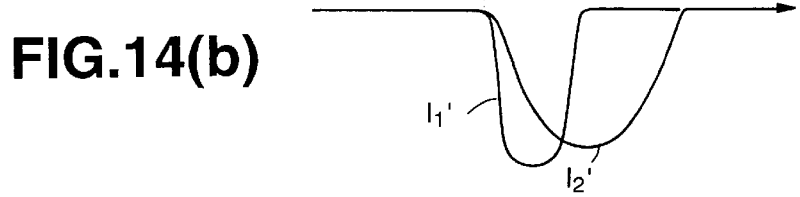

By determining as described above, the electric charge is transferred from the transferring capacitors Cn1, Cn2 to the peaking capacitor Cp as shown in FIGS. 14(a) and 14(b).

In the second example, since the finely adjusting saturable reactors BLn1, BLn2 are set to have the same assist time, they have the same saturation timing. Therefore, when the finely adjusting saturable reactors BLn1, BLn2 are saturated, the electric charge transfer (I1') from the transferring capacitor Cn1 to the peaking capacitor Cp is started at the same time with the electric charge transfer (I2') from the transferring capacitor Cn2 to the peaking capacitor Cp.

In the second example, however, the post-saturation inductances La1, La2 of the two magnetically coupled saturable reactors ALn1, ALn2 have a relation of La1<La2. Therefore, the current pulse I2 has a longer electric charge transfer time than the current pulse I1 as shown in FIGS. 14(a) and 14(b).

As described above, the second example connects the finely adjusting saturable reactors BLn1, BLn2 to the magnetically coupled saturable reactors ALn1, ALn2, so that the timing of starting the electric charge transfer in the final stage can be delayed. And, the post-saturation inductances La1, La2 of the magnetically coupled saturable reactors ALn1, ALn2 are also different. Therefore, the electric charge transfer (I1') from the transferring capacitor Cn1 to the peaking capacitor Cp and the electric charge transfer (I2') from the transferring capacitor Cn2 to the peaking capacitor Cp are started at the same time, but their electric charge transfer time is different. Therefore, the peaking capacitor Cp is charged over a relatively long time as shown in FIGS. 13(a) and 13(b). Thus, there is caused a phenomenon that the electric charge is further transferred to the peaking capacitor while the laser light is emitted after starting the discharge, so that the luminescence time of the laser light can be extended, and its luminescence intensity per unit time can be decreased.

(3) As a third example in the circuit of FIG. 12, the post-saturation inductances La1, La2 of the two magnetically coupled saturable reactors ALn1, ALn2 are different (e.g., La1<La2), and the two finely adjusting saturable reactors BLn1, BLn2 have a different assist time.

Figure 15:
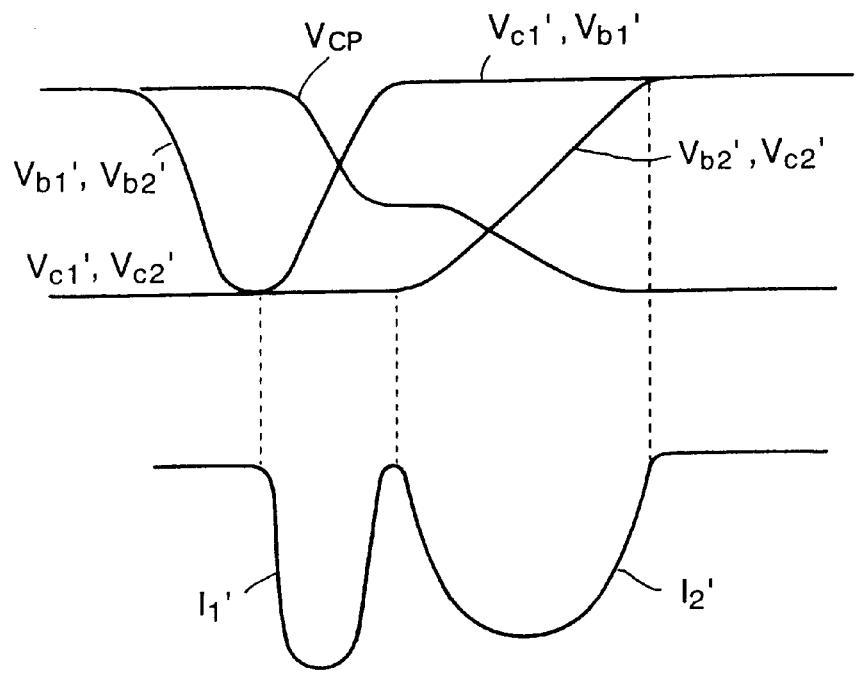
FIG. 15 is a time chart of a current voltage of a third example of the embodiment of FIG. 12.

By determining as described above, the electric charge is transferred from the transferring capacitors Cn1, Cn2 to the peaking capacitor Cp as shown in FIG. 15.

In the third example, since the post-saturation inductances La1, La2 of the two magnetically coupled saturable reactors ALn1, ALn2 are different (La1<La2), the current pulse I2' has a longer electric charge transfer time than the current pulse I1' as shown in FIG. 15. And, since the two finely adjusting saturable reactors BLn1, BLn2 have different assist times (the reactor BLn1 has a shorter assist time than the reactor BLn2 in FIG. 15), the electric charge transfer of the electric current pulse I1 is started earlier than the electric current pulse I2.

As described above, in the third example, the electric charge transfer (I1') from the transferring capacitor Cn1 to the peaking capacitor Cp and the electric charge transfer (I2') from the transferring capacitor Cn2 to the peaking capacitor Cp have different start timing and electric charge transfer time, so that the peaking capacitor Cp is charged over a relatively long time as shown in FIG. 15. Thus, there is caused a phenomenon that the electric charge is further transferred to the peaking capacitor while the laser light is emitted after starting the discharge, so that the luminescence time of the laser light can be extended, and its luminescence intensity per unit time can be decreased.

(4) As a fourth example in the circuit of FIG. 12, the post-saturation inductances of the two magnetically coupled saturable reactors ALn1, ALn2 are the same, and the assist times of the two finely adjusting saturable reactors BLn1, BLn2 are also the same.

Figure 16:
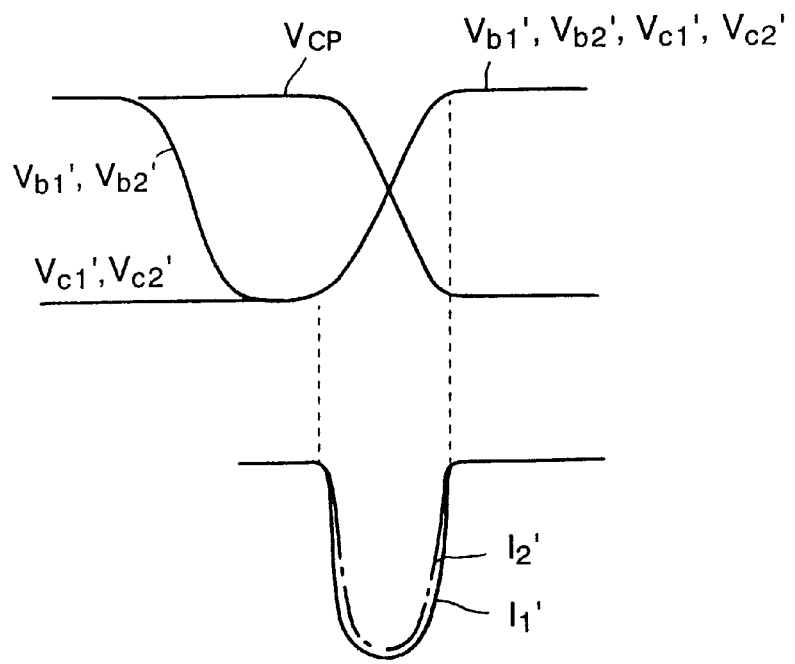
FIG. 16 is a time chart of a current voltage of a fourth example of the embodiment of FIG. 12.

By determining as described above, the electric charge is transferred from the transferring capacitors Cn1, Cn2 to the peaking capacitor Cp as shown in FIG. 16.

Specifically, since the finely adjusting saturable reactors BLn1, BLn2 have the same assist time, the transfer initiation times of the current pulses I1', I2' do not differ. But, since the finely adjusting saturable reactors BLn1, BLn2 are inserted, the electric charge transfer initiation timings of the current pulses I1', I2' are delayed as compared with a case that they are not inserted. And, the post-saturation reactance of the respective circuits are increased for an increment of the inserted finely adjusting saturable reactors BLn1, BLn2, and the electric charge transfer times of the current pulses I1', I2' are also extended.

As described above, in the fourth example, according to the finely adjusting saturable reactors BLn1, BLn2, the initiation timing for the electric charge transfer from the plurality of transferring capacitors Cn1, Cn2 to the peaking capacitor Cp is delayed, and their electric charge transfer times can be adjusted to be long, so that the luminescence time of the laser light can be extended, and its luminescence intensity per unit time can be decreased.

Figure 17:
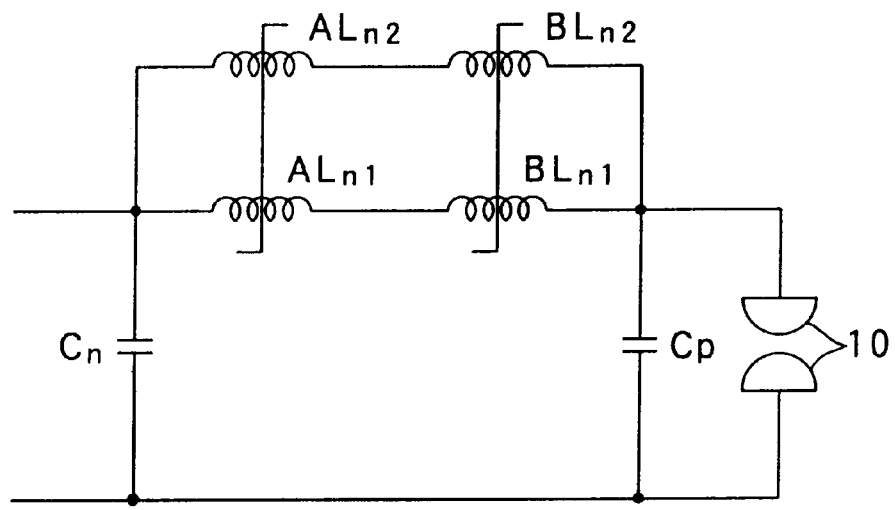
FIG. 17 is an equivalent circuit diagram showing another embodiment of the invention shown in FIG. 12.

FIG. 17 is an equivalent circuit diagram showing another embodiment of the present invention shown in FIG. 12.

In this embodiment, the magnetically coupled saturable reactors ALn1, ALn2 and the finely adjusting saturable reactors BLn1, BLn2 connected in series to the saturable reactors ALn1, ALn2 in the electric charge transfer circuit in the final stage are connected in parallel to the peaking capacitor Cp, and the transferring capacitor Cn is remained to be one in the same way as before. In other words, only the difference of the circuit of FIG. 17 from the circuit of FIG. 12 is that the transferring capacitor Cn is remained single in the same way as before.

In the circuit of FIG. 17, the transferring capacitor Cn is one, but the electric charge transfer route to the peaking capacitor Cp is provided in multiple numbers in the same way as the circuit of FIG. 12, and substantially the same effect as the circuit of FIG. 12 can be obtained by performing the electric charge transfer through the plurality of routes. In the circuit of FIG. 17, however, when the electric charge transfer is started through one of the two electric charge transfer routes, a voltage of the transferring capacitor Cn drops, so that when the electric charge transfer is started through the other route, the electric charge must be transferred in a state that an amount of transferred electric charge of the transferring capacitor Cn is decreased. Therefore, various works of adjusting the circuit are troublesome as compared with the circuit of FIG. 12.

As described above, the circuit structure of FIG. 17 can also adopt the adjustment of the electric charge initiation timing or the electric charge transfer time described in the first to fourth examples of the circuit of FIG. 12.

Specifically, in a first example of the circuit of FIG. 17, two finely adjusting saturable reactors BLn1, BLn2 are set to have different assist times.

In a second example of the circuit of FIG. 17, it is determined that post-saturation inductances La1, La2 of two magnetically coupled saturable reactors ALn1, ALn2 are different, and the assist times of the two finely adjusting saturable reactors BLn1, BLn2 are the same.

In a third example of the circuit of FIG. 17, it is determined that post-saturation inductances La1, La2 of two magnetically coupled saturable reactors ALn1, ALn2 are different, and the assist times of the two finely adjusting saturable reactors BLn1, BLn2 are also different.

In a fourth example of the circuit of FIG. 17, it is determined that post-saturation inductances of two magnetically coupled saturable reactors ALn1, ALn2 are the same, and the assist times of the two finely adjusting saturable reactors BLn1, BLn2 are also the same.

In the embodiment of FIG. 17, substantially the same electric charge transfer state as in FIG. 12 can be produced, so that the luminescence time of the laser light can be extended, and the luminescence intensity per unit time can be decreased.

Figure 18:
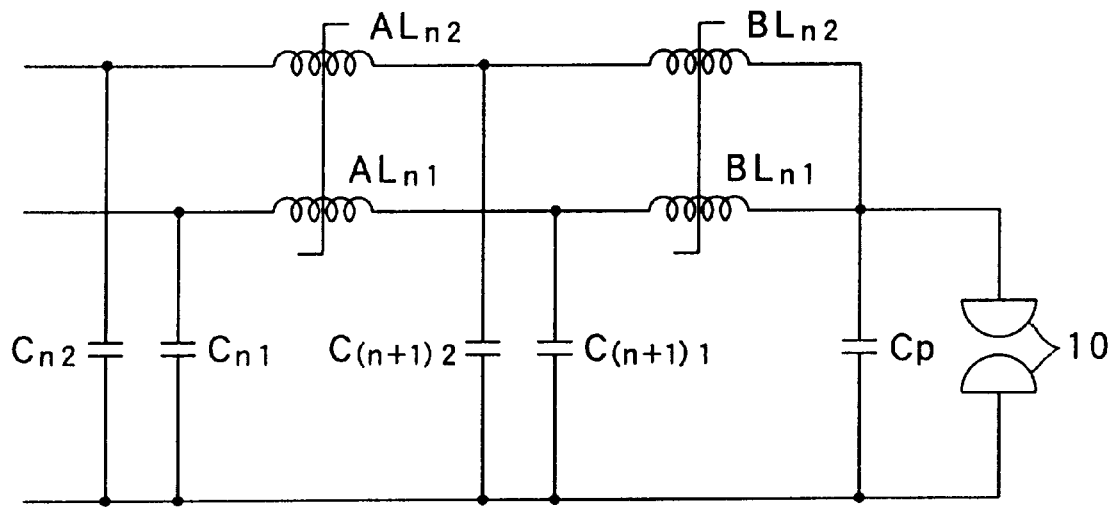
FIG. 18 is an equivalent circuit diagram showing another embodiment of the invention shown in FIG. 12.

FIG. 18 shows still another embodiment of the present invention shown in FIG. 12.

In the embodiment of FIG. 18, the finely adjusting saturable reactors BLn1, BLn2 are not inserted into the electric charge transfer circuit in the final stage as in the embodiments of FIG. 12 and FIG. 17, but one stage of the electric charge transfer circuit consisting of the finely adjusting saturable reactors BLn1, BLn2 and the transferring capacitors C(n+1)1, C(n+1)2 is added to the final stage.

In FIG. 18, the charge transfer circuit in the stage before the final stage by one has capacitors Cn1, Cn2 and saturable reactors ALn1, ALn2 connected in series to the capacitors. The saturable reactors ALn1, ALn2 are magnetically coupled.

The electric charge transfer circuit in the final stage has the capacitors C(n+1)1, C(n+1)2 and the finely adjusting saturable reactors BLn1, BLn2 connected in series to the capacitors. The finely adjusting saturable reactors BLn1, BLn2 are not coupled magnetically. These finely adjusting saturable reactors BLn1, BLn2 have different assist times so to have different saturation timings.

In the circuit of FIG. 18, basically the transfer of the electric charge from the capacitors Cn1, Cn2 to the capacitors C(n+1)1, C(n+1)2 through a plurality of electric charge transfer routes is started at the same time by magnetically coupling the saturable reactors ALn1, ALn2 of the electric charge transfer circuit in the previous stage, the electric charge transfer from the capacitors C(n+1)1, C(n+1)2 to the peaking capacitor Cp through the plurality of electric charge transfer routes is started with a time lag by the finely adjusting saturable reactors BLn1, BLn2 of the electric charge transfer circuit in the final stage to obtain the same effect as in the previous embodiment. In other words, substantially the same action and effect as in the first example can be obtained by having the same post-saturation inductances of the magnetically coupled saturable reactors ALn1, ALn2.

The post-saturation inductance of each saturable reactor can make various types of settings as described above.

For example, in the circuit of FIG. 18, electric charge transfer durations from the capacitors Cn1, Cn2 to the capacitors C(n+1)1, C(n+1)2 through the plurality of electric charge transfer routes can be differed by having different post-saturation inductances of the magnetically coupled saturable reactors ALn1, ALn2. Therefore, in this case, the timing of initiating the electric charge transfer from the capacitors C(n+1)1, C(n+1)2 to the peaking capacitor Cp through the plurality of electric charge transfer routes and the electric charge transfer duration from the capacitors Cn1, Cn2 to the capacitors C(n+1)1, C(n+1)2 through the plurality of electric charge transfer routes are different, so that when the electric charge is transferred to the peaking capacitor Cp, the timing of initiating the electric charge transfer and the electric charge transfer duration through the respective transfer route can be differed.

And, in the circuit of FIG. 18, the post-saturation inductance of the finely adjusting saturable reactors BLn1, BLn2 which are not coupled magnetically may be made different. Thus, the timing of initiating the electric charge transfer and the electric charge transfer duration from the capacitors C(n+1)1, C(n+1)2 to the peaking capacitor Cp through the plurality of electric charge transfer routes can be made different.

By the circuit structure shown in FIG. 18, the luminescence time of the laser light can be extended, and its luminescence intensity per unit time can be decreased.

Figure 19:
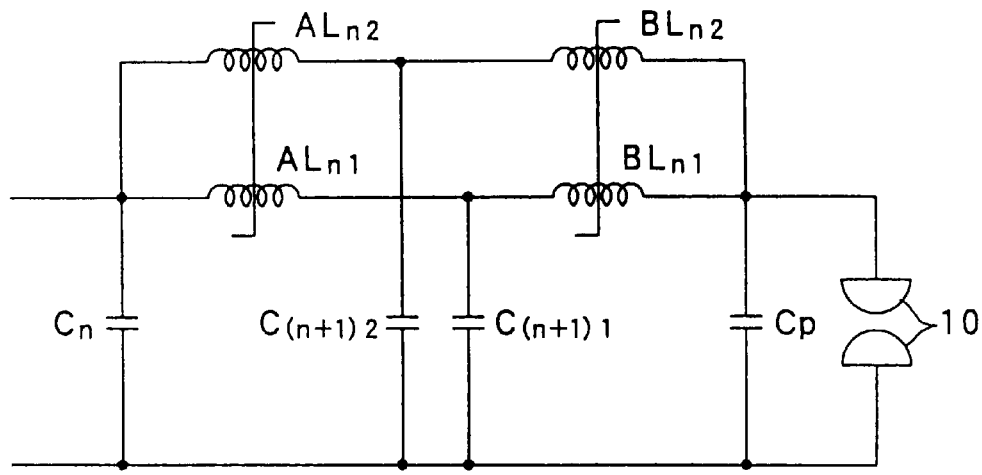
FIG. 19 is an equivalent circuit diagram showing another embodiment of the invention shown in FIG. 12.

FIG. 19 is an equivalent circuit diagram showing still another embodiment of the invention shown in FIG. 12.

In this embodiment, the capacitor Cn contained in the electric charge transfer circuit in the stage before the final stage by one is single in the same way as before. Other points are the same as in the circuit shown in FIG. 18.

In other words, in the embodiment of FIG. 19, the saturable reactors ALn1, ALn2 of the electric charge transfer circuit in the previous stage are magnetically coupled, and the saturation timings of the finely adjusting saturable reactors BLn1, BLn2 of the electric charge transfer circuit in the final stage are made different.

And, in this case, the post-saturation inductances of the magnetically coupled saturable reactors ALn1, ALn2 may be made different, and the post-saturation inductances of the finely adjusting saturable reactors BLn1, BLn2 may be differed.

In the circuit structure shown in FIG. 19, the luminescence time of the laser light can be extended, and its luminescence intensity per unit time can be decreased.

What is claimed is:

1. A power supply unit for a pulse laser comprising discharge electrodes for a pulse laser disposed in a laser medium, a peaking capacitor connected in parallel to the discharge electrodes and a series circuit of a saturable reactor and a transferring capacitor connected in parallel to the peaking capacitor, which transfers electric charges charged in the transferring capacitor to the peaking capacitor by utilizing a magnetic saturation phenomenon of the saturable reactor to cause a pulse discharge between the discharge electrodes and excites the laser meduim so to produce the pulse laser, wherein the series circuit of the saturable reactor and the transferring capacitor is connected in a plurality of numbers in parallel to the peaking capacitor, the plurality of saturable reactors are magnetically coupled, and post-saturation inductances of the plurality of saturable reactors are made different.

2. A power supply unit for a pulse laser according to claim 1, wherein a diode, which is connected in series to the saturable reactors and has conduction in a direction that the electric charge is transferred from the transferring capacitors to the peaking capacitor, is further disposed, and the plurality of transferring capacitors are charged in advance.

3. A power supply unit for a pulse laser comprising discharge electrodes for a pulse laser disposed in a laser medium, a peaking capacitor connected in parallel to the discharge electrodes and a series circuit of a saturable reactor and a transferring capacitor connected in a plurality of numbers in parallel to the peaking capacitor, which transfers electric charges charged in the transferring capacitors to the peaking capacitor by utilizing a magnetic saturation phenomenon of the saturable reactors to cause a pulse discharge between the discharge electrodes and excites the laser medium so to produce the pulse laser, wherein the saturable reactors are divided into parallel circuits of plurality of saturable reactors, the plurality of saturable reactors are magnetically coupled, and post-saturation inductances of the plurality of saturable reactors are made different.

4. A power supply unit for a pulse laser according to claim 3, wherein a diode which is connected in series to the saturable reactors and has conduction in a direction that the electric charge is transferred from the transferring capacitors to the peaking capacitor, and the transferring capacitors are charged in advance.

5. A power supply unit for a pulse laser comprising discharge electrodes for a pulse laser disposed in a laser medium, peaking capacitor connected in parallel to the discharge electrodes and a series circuit of a saturable reactor and a transferring capacitor connected in parallel to the peaking capacitor, which transfers electric charges charged in the transferring capacitor to the peaking capacitor by utilizing a magnetic saturation phenomenon of the saturable reactor to cause a pulse discharge between the discharge electrodes and excites the laser medium so to produce the pulse laser, wherein
the series circuit of the saturable reactor and the transferring capacitor is connected in a plurality of numbers in parallel to the peaking capacitor, and
the plurality of saturable reactors are magnetically coupled, and saturable reactors for finely adjusting a transfer initiation time are connected in series to the plurality of saturable reactors.

6. A power supply unit for a pulse laser according to claim 5, wherein assist times of the plurality of saturable reactors for finely adjusting the transfer initiation time are made different.

7. A power supply unit for a pulse laser according to claim 5, wherein post-saturation inductances of the plurality of magnetically coupled saturable reactors are made different.

8. A power supply unit for a pulse laser according to claim 6, wherein post-saturation inductances of the plurality of magnetically coupled saturable reactors are made different.

9. A power supply unit for a pulse laser comprising discharge electrodes for a pulse laser disposed in a laser medium, a peaking capacitor connected in parallel to the discharge electrodes and a series circuit of a saturable reactor and a transferring capacitor connected in a plurality of numbers in parallel to the peaking capacitor, which transfers electric charges charged in the transferring capacitors to the peaking capacitor by utilizing a magnetic saturation phenomenon of the saturable reactors to cause a pulse discharge between the discharge electrodes and excites the laser medium so to produce the pulse laser, wherein
the saturable reactors are divided into parallel circuits of a plurality of magnetically coupled saturable reactors, and saturable reactors for finely adjusting a transfer initiation time are connected in series to the plurality of saturable reactors.

10. A power supply unit for a pulse laser according to claim 9, wherein assist times of the plurality of saturable reactors for finely adjusting a transfer initiation time are made different.

11. A power supply unit for pulse laser according to claim 9, wherein post-saturation inductances of the plurality of magnetically coupled saturable reactors are made different.

12. A power supply unit for a pulse laser according to claim 10, wherein post-saturation inductances of the plurality of magnetically coupled saturable reactors are made different.

13. A power supply unit for a pulse laser comprising:
discharge electrodes for a pulse laser disposed in a laser medium;
a peaking capacitor connected in parallel to the discharge electrodes;
an electric charge transfer circuit in a final stage which has a plurality of series circuits connected in parallel to the peaking capacitor and comprised of a plurality of first capacitors and a plurality of saturable reactors for finely adjusting a transfer initiation time; and an electric charge transfer circuit in a stage before the final stage by one which has a plurality of series circuits comprised of a plurality of second capacitors and a plurality of saturable reactors connected to each of the plurality of first capacitors, the power supply unit causing a pulse discharge between the discharge electrodes by transferring the electric charge charged in the plurality of second capacitors to the peaking capacitor through the plurality of first capacitors by using a magnetic saturation phenomenon of the saturable reactors and excites the laser medium so to produce the pulse laser, wherein the plurality of saturable reactors in the electric charge transfer circuit in the stage before the final stage by one are magnetically coupled, and saturation timings of the plurality of saturable reactors for finely adjusting the transfer initiation time included in the electric charge transfer circuit in the final stage are made different.

14. A power supply unit for a pulse laser according to claim 13, wherein post-saturation inductances of the plurality of magnetically coupled saturable reactors of the electric charge transfer circuit in the stage before the final stage by one are made different.

15. A power supply unit for a pulse laser according to claim 13, wherein post-saturation inductances of the plurality of saturable reactors for finely adjusting the transfer initiation time included in the electric charge transfer circuit in the final stage are made different.

16. A power supply unit for a pulse laser comprising:

discharge electrodes for a pulse laser disposed in a laser medium;

a peaking capacitor connected in parallel to the discharge electrodes;

an electric charge transfer circuit in a final stage which has a plurality of series circuits connected in parallel to the peaking capacitor and comprised of a plurality of first capacitors and a plurality of saturable reactors for finely adjusting a transfer initiation time; and an electric charge transfer circuit in a stage before the final stage by one which has a plurality of saturable reactors connected in series to each of the plurality of first capacitors and a single second capacitor connected in parallel to the plurality of saturable reactors, the power supply unit causing a pulse discharge between the discharge electrodes by transferring the electric charge charged in the second capacitor to the peaking capacitor through the plurality of first capacitors by using a magnetic saturation phenomenon of the saturable reactors and exciting the laser medium so to produce the pulse laser, wherein the plurality of saturable reactors in the electric charge transfer circuit in the stage before the final stage by one are magnetically coupled, and saturation timings of the plurality of saturable reactors for finely adjusting the transfer initiation time included in the electric charge transfer circuit in the final stage are made different.

17. A power supply unit for a pulse laser according to claim 16, wherein post-saturation inductances of the plurality of magnetically coupled saturable reactors of the electric charge transfer circuit in the stage before the final stage by one are made different.

18. A power supply unit for a pulse laser according to claim 16, wherein post-saturation inductances of the plurality of saturable reactors for finely adjusting the transfer initiation time included in the electric charge transfer circuit in the final stage are made different.

* * * * *